United States Patent
Carey et al.

(10) Patent No.: US 7,525,775 B2
(45) Date of Patent: *Apr. 28, 2009

(54) OBLIQUE ANGLE ETCHED UNDERLAYERS FOR IMPROVED EXCHANGE BIASED STRUCTURES IN A MAGNETORESITIVE SENSOR

(75) Inventors: Matthew Joseph Carey, San Jose, CA (US); Jeffrey Robinson Childress, San Jose, CA (US); James Mac Freitag, Sunnyvale, CA (US); Stefan Maat, San Jose, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 440 days.

This patent is subject to a terminal disclaimer.

(21) Appl. No.: 11/283,033

(22) Filed: Nov. 17, 2005

(65) Prior Publication Data
US 2007/0109692 A1     May 17, 2007

(51) Int. Cl.
*G11B 5/39* (2006.01)
(52) U.S. Cl. .................................. 360/324.11
(58) Field of Classification Search .... 360/324.1–324.2
See application file for complete search history.

(56) References Cited

U.S. PATENT DOCUMENTS 6,937,447 B2 *  8/2005  Okuno et al. ............ 360/324.1
7,336,454 B2 *  2/2008  Fukuzawa et al. ...... 360/324.12
2005/0068697 A1 * 3/2005  Pinarbasi ................ 360/324.12

FOREIGN PATENT DOCUMENTS

EP        0 634 740 A2    1/1998

OTHER PUBLICATIONS

Chinese Office Action Summary From Chinese Application No. 200610149421.6 issued on Nov. 21, 2008.

* cited by examiner

*Primary Examiner*—A. J. Heinz
(74) *Attorney, Agent, or Firm*—Zilka-Kotab, PC

(57) ABSTRACT

A magnetoresistive sensor having improved pinning field strength. The sensor includes a pinned layer structure pinned by exchange coupling with an antiferromagnetic (AFM) layer. The AFM layer is constructed upon an under layer having treated surface with an anisotropic roughness. The anisotropic roughness, produced by an angled ion etch, results in improved pinning strength. The underlayer may include a seed layer and a thin layer of crystalline material such as PtMn formed over the seed layer. The magnetic layer may include a first sub-layer of NiFeCr and a second sub-layer of NiFe formed there over. The present invention also includes a magnetoresistive sensor having a magnetic layer deposited on an underlayer (such as a non-magnetic spacer) having a surface treated with an anisotropic texture. An AFM layer is then deposited over the magnetic layer. The magnetic layer is then strongly pinned by a combination of exchange coupling with the AFM layer and a strong anisotropy provided by the surface texture of the underlayer. Such a structure can be used for example in a sensor having a pinned layer structure formed above the free layer, or in a sensor having an in stack bias structure.

32 Claims, 8 Drawing Sheets

OBLIQUE ANGLE ETCHED UNDERLAYERS FOR IMPROVED EXCHANGE BIASED STRUCTURES IN A MAGNETORESITIVE SENSOR

The present invention is related to patent application Ser. No. 11/097,543 filed on Mar. 31, 2005 entitled METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC IN-STACK BIAS LAYER.

The present invention is related to patent application Ser. No. 11/097,546 filed on Mar. 31, 2005 entitled A METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN A HARD MAGNETIC PINNING LAYER.

The present invention is related to patent application Ser. No. 11/097,846 filed on Mar. 31, 2005 entitled A METHOD FOR MANUFACTURING A MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS.

The present invention is related to patent application Ser. No. 11/096,636 filed on Mar. 31, 2005 entitled MAGNETIC READ SENSOR EMPLOYING OBLIQUE ETCHED UNDERLAYERS FOR INDUCING UNIAXIAL MAGNETIC ANISOTROPY IN HARD MAGNETIC BIAS LAYERS.

The present invention is related to patent application Ser. No. 11/097,920 filed on Mar. 31, 2005 entitled MAGNETIC READ SENSOR EMPLOYING OBLIQUE ETCHED UNDERLAYERS FOR INDUCING UNIAXIAL MAGNETIC ANISOTROPY IN HARD MAGNETIC PINNING LAYERS.

The present invention is related to patent application Ser. No. 11/097,638 filed on Mar. 31, 2005 entitled MAGNETIC READ SENSOR EMPLOYING OBLIQUE ETCHED UNDERLAYERS FOR INDUCING UNIAXIAL MAGNETIC ANISOTROPY IN HARD MAGNETIC IN-STACK BIAS LAYERS.

The present invention is related to patent application Ser. No. 11/177,990 filed on Jul. 7, 2005 entitled MAGNETIC READ SENSOR EMPLOYING OBLIQUE ETCHED UNDERLAYERS FOR INDUCING UNIAXIAL MAGNETIC ANISOTROPY IN A SELF BIASED FREE LAYER.

FIELD OF THE INVENTION

The present invention relates to magnetoresistive field sensors and more particularly to a sensor having an improved pinning field induced by forming an antiferromagnetic (AFM) layer over an underlayer configured with an anisotropic roughness.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of nanometers. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

In a typical design the write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer, both of which can be made up by a plurality of layers. First and second leads are connected to the spin valve sensor for conducting a sense current therethrough. The magnetization of the pinned layer is pinned substantially perpendicular to the air bearing surface (ABS) and is relatively insensitive to applied magnetic fields. The magnetic moment of the free layer is biased substantially parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. Since $\Theta$ is near 90 degrees at zero field, the resistance of the spin valve sensor (for small rotations of the free layer from 90 degrees) changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP pinned spin valve includes first and second magnetic layers separated by a thin nonmagnetic coupling layer such as Ru or Ir. The thickness of the coupling layer is chosen so as to antiparallel couple the magnetic moments of the ferromagnetic layers of the pinned layer. A spin valve is also known as a top or bottom spin valve depending upon whether the pinning layer is at the top (formed after the free layer) or at the bottom (before the free layer).

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a net magnetic moment, when exchange coupled with a magnetic material, it can strongly pin the magnetization of the ferromagnetic layer.

A current in plane (CIP) spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

The ever increasing demand for greater data rate and recording density has lead a push to develop sensors having ever decreased dimensions, such as decreased track width gap thickness and stripe height. A challenge that arises as a result of these decreased dimensions is that the pinning field strength decreases dramatically. This is, for example, due to the decreased area over which the exchange coupling between the AFM pinning layer and the pinned layer. Other factors related to decreased sensor size also reduce the pinning field strength.

This reduced pinning field leads to catastrophic sensor failure. For, example, during an event such as an electrostatic discharge or a head disk contact, pinning may become sufficiently weak that the magnetizations of the AP1 and AP2 layers can flip 180 degrees. This is called amplitude flipping, and it renders the head unusable.

Therefore, there is a strong felt need for a structure that can increase the pinning field strength of a magnetoresistive sensor. This increase in pinning strength would preferably require little additional manufacturing cost or complexity.

SUMMARY OF THE INVENTION

The present invention provides a magnetoresistive sensor having improved pinning field strength. The sensor includes an AFM layer formed over an underlayer. The underlayer has a surface exhibiting an anisotropic roughness that increases the pinning field of a pinned layer that is exchange coupled with the AFM layer.

The underlayer may include first and second seed layers and a thin layer of a crystalline material such as PtMn formed over the seed layers. The first seed layer may be NiFeCr, and the second seed layer may be NiFe.

The anisotropic roughness can be formed by performing an ion etch on the surface of the underlayer prior to depositing the AFM layer. The ion etch can be performed at an oblique angle with respect to the surface of the underlayer. This oblique angle can be for example, 20-80 degrees or 35-65 degrees with respect to a normal to the surface of the underlayer.

The anisotropic roughness in the surface of the underlayer advantageously increases the pinning field strength. For example, an increase in pinning field of about 9 percent has been achieved by use of the present invention.

The present invention is also embodied in a sensor having a magnetic layer formed on an underlayer, and an AFM layer formed over the magnetic layer. The underlayer is treated with an anisotropic surface texture that induces a strong magnetic anisotropy in the magnetic layer. This strong anisotropy, in combination with a strong exchange coupling with the AFM layer, very strongly pins the magnetization of the magnetic layer.

This structure can be used to construct a magnetoresitive sensor having a pinned layer structure formed at the top of the sensor. In this case an AP pinned layer could be deposited over a surface treated underlayer, which could be the spacer layer between the free layer and the pinned layer. An AFM layer can then be deposited over the pinned layer structure.

The above described structure (magnetic layer deposited on a surface treated underlayer and an AFM layer deposited over the magnetic layer) can also be used in a sensor having an in stack bias structure. In this case, the surface treated underlayer can be a non-magnetic coupling layer sandwiched between a magnetic bias layer and a free layer.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
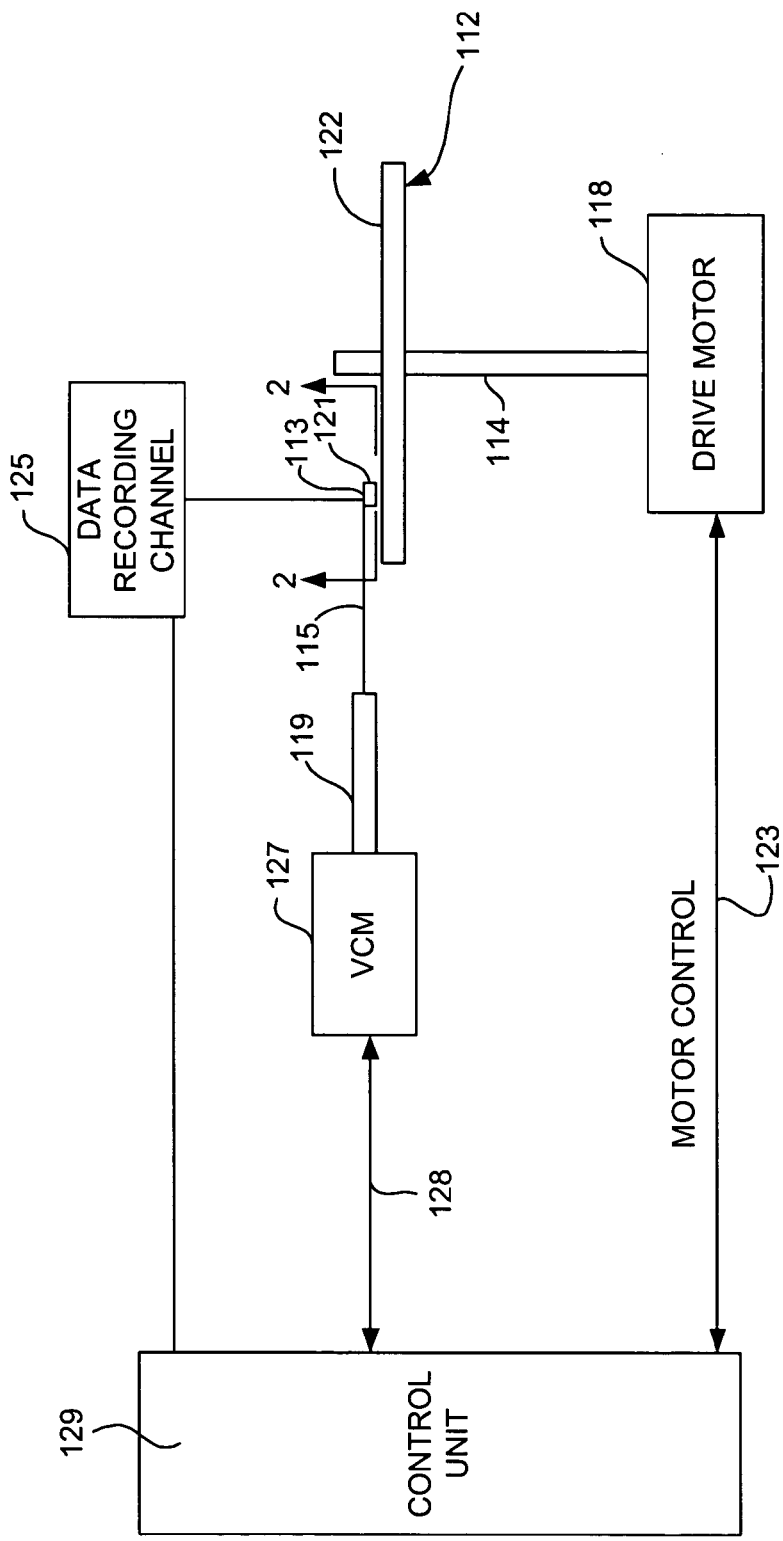
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
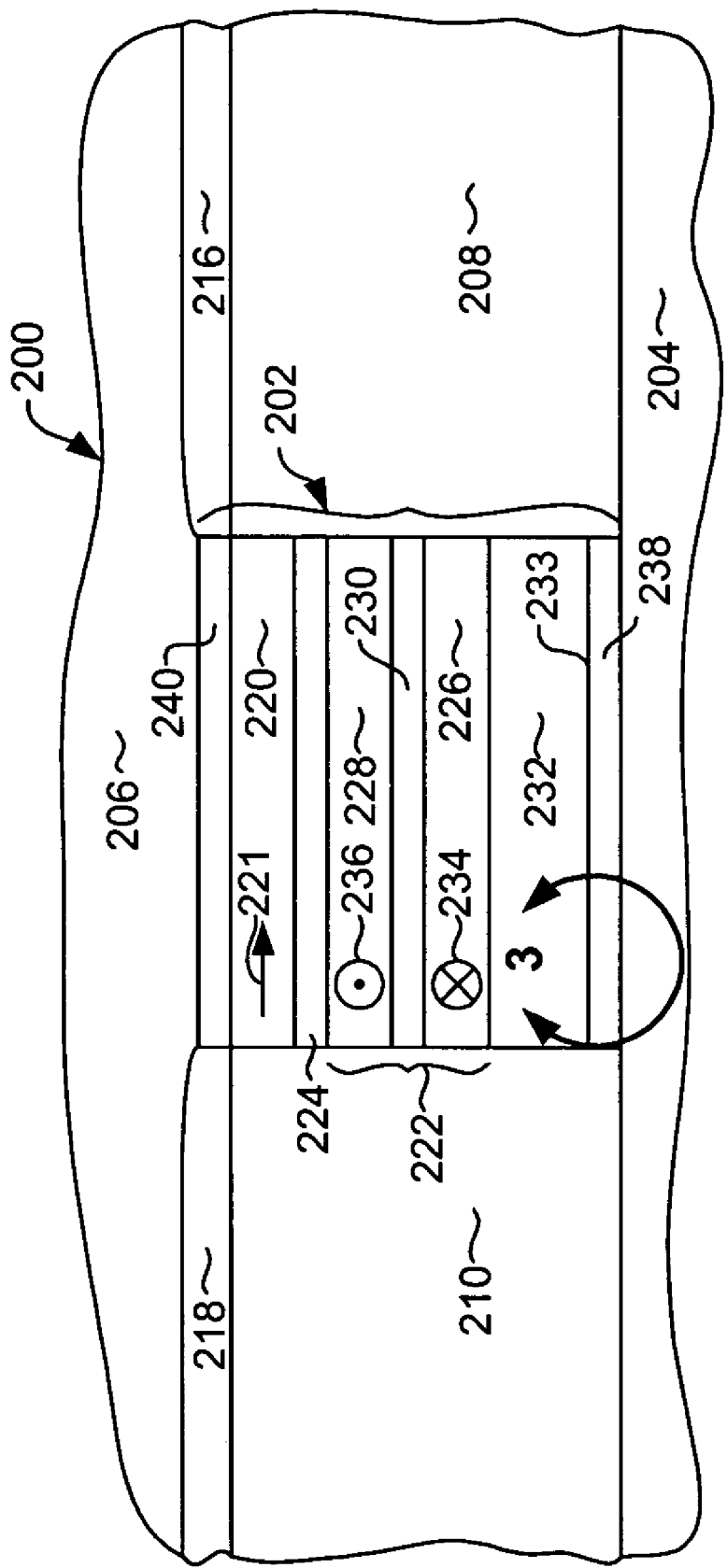
FIG. 2, is an ABS view of a CIP sensor according to a first embodiment of the invention.

With reference now to FIG. 2, a CIP GMR sensor 200 having increased pinning field strength according to an embodiment of the present invention is described. The sensor 200 includes a sensor stack 202 sandwiched between first and second non-magnetic, electrically insulating gap layers 204, 206. The first and second hard bias layers 208, 210 extend laterally from the sides of the sensor stack 202. The hard bias layers are constructed of a hard magnetic material such as CoPt or CoPtCr. First and second leads 216, 218 are deposited over the hard bias layers 208, 210, and may be constructed of for example Au, Rh or some other electrically conductive material.

With continued reference to FIG. 2, the sensor stack 202 includes a magnetic free layer 220, a magnetic pinned layer structure 222 and a spacer layer 224 sandwiched between the free and pinned layers 220, 222, respectively. The free layer 220 has a magnetization 221 that is biased in a direction substantially parallel with the ABS, but that is free to rotate in response to a magnetic field. Biasing of the free layer magnetization 221 is provided by magnetostatic coupling with the hard bias layers 208, 210. The free layer 220 can be constructed of one or more layers of for example NiFe, Co, CoFe or other sufficiently soft magnetic material, preferably with a layer of Co or CoFe adjacent to the spacer layer 224. The spacer layer 224 can be constructed of a non-magnetic, electrically conductive material such as Cu. The invention could also be embodied in a current perpendicular to the plane (CPP) GMR sensor or tunnel valve sensor. In case of a tunnel valve sensor layer 224 would be a thin, non-magnetic, electrically conductive barrier layer. A capping layer 240, such as Ta, may be provided at the top of the sensor stack 202 to protect the layers of the sensor stack 202 from damage during manufacture. For a CPP GMR or tunnel valve sensor the hard-bias 208, 210 is separated from the sensor stack 202 by insulating material to prevent electrical shunting. The electrically insulating gap layers 204, 206 would be replaced with electrically conductive lead layers.

The pinned layer 222 is preferably an AP coupled pinned layer having first and second magnetic layers AP1 226 and AP2 228 which are antiparallel coupled across an AP coupling layer 230. The AP1 and AP2 layers can be for example CoFe or some other suitable magnetic material. The coupling layer 230 can be constructed of, for example, Ru or Ir and is constructed of a thickness chosen to strongly antiparallel couple the magnetic moments 234 and 236 of the AP1 and AP2 layers, respectively. The coupling layer 230 can be for example 2-10 Angstroms thick or about 8 Angstroms thick. The AP1 layer 226 is exchange coupled with a layer of antiferromagnetic material (AFM layer 232) which strongly pins the magnetic moment 234 of the AP1 layer 226 in a desired direction substantially perpendicular to the ABS and due to AP coupling of the AP1 and AP2 layers 226 and 228 pins the moment 236 of the AP2 layer 228 in a desired direction substantially perpendicular to the ABS, but antiparallel with the moment 234 of the AP1 layer 226.

Figure 3:
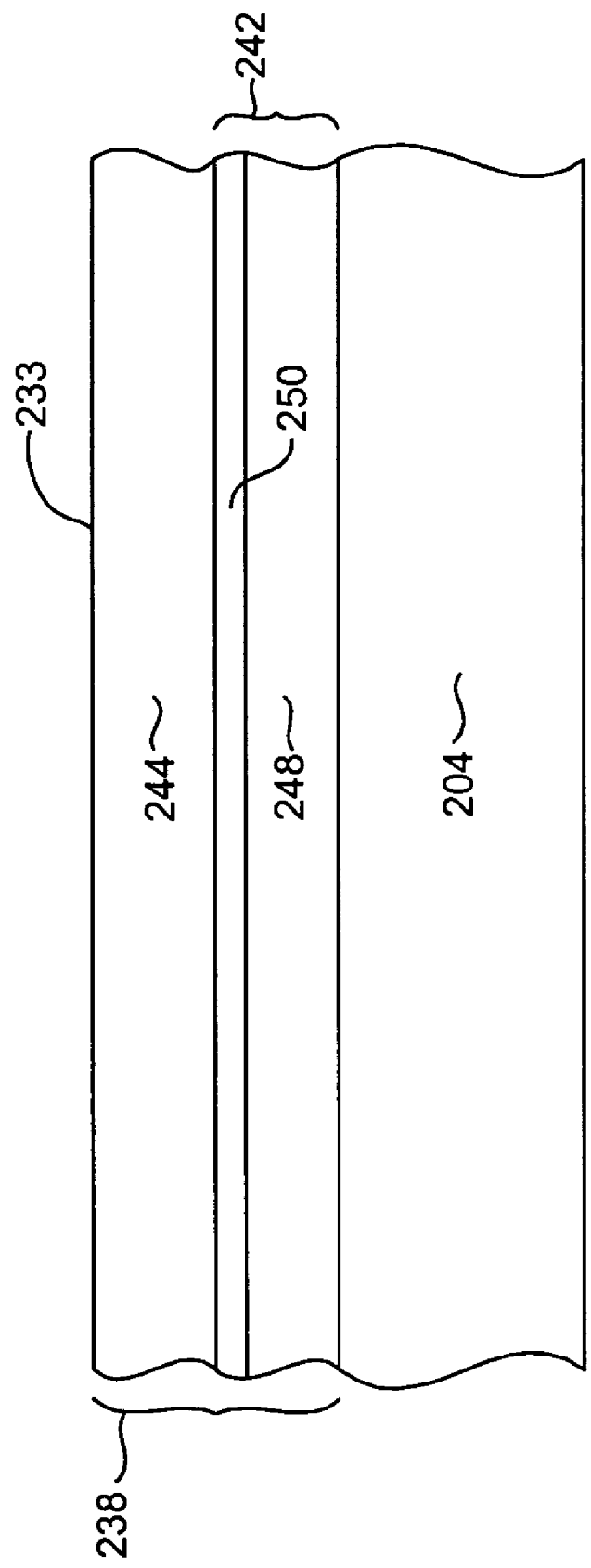
FIG. 3 is a view of a view taken from circle 3 of FIG. 2 showing an enlarged view of an underlayer according to the present invention.

A specially treated underlayer 238 is formed under the AFM layer 232, and promotes a strong pinning field in the pinned layer 222. The underlayer 238 has a surface 233 that has been treated by a method to be described below, which provides the surface 233 with an anisotropic roughness that greatly improves pinning field strength. The under-layer 238 can be understood more clearly with reference to FIG. 3. With reference to FIG. 3 it can be seen that the under-layer 238 has a first layer portion 242 and a second layer portion 244 formed there over. The second layer portion 244 has a specially treated surface 233 having an anisotropic roughness. The first layer portion 242 of the under-layer is constructed of a seed material, and preferably includes a first sub-layer 248 constructed of NiFeCr and a second sub-layer 250 constructed of NiFe formed over the first sub-layer 248. The first sub-layer 248 can have a thickness of 20 to 30 Angstroms or about 25 Angstroms. The second sub-layer 250 can have a thickness of 4 to 15 Angstroms or about 8 Angstroms. The second layer portion 244 can be constructed of a material having a crystalline structure such as PtMn and can have a thickness of 5 to 50 angstroms or about 10 Angstroms after the surface treatment has been performed as will be discussed below. Although the second layer portion 244 may be constructed of PtMn, this layer is too thin to act as an antiferromagnetic layer and functions as a seed layer. For example, the thickness of the layer 244 after ion etching (as described below) can be about 10 Angstroms, whereas the antiferromagnetic layer 232 deposited over the underlayer 238 has a much larger thickness, such as 100-150 Angstroms.

Figure 4:
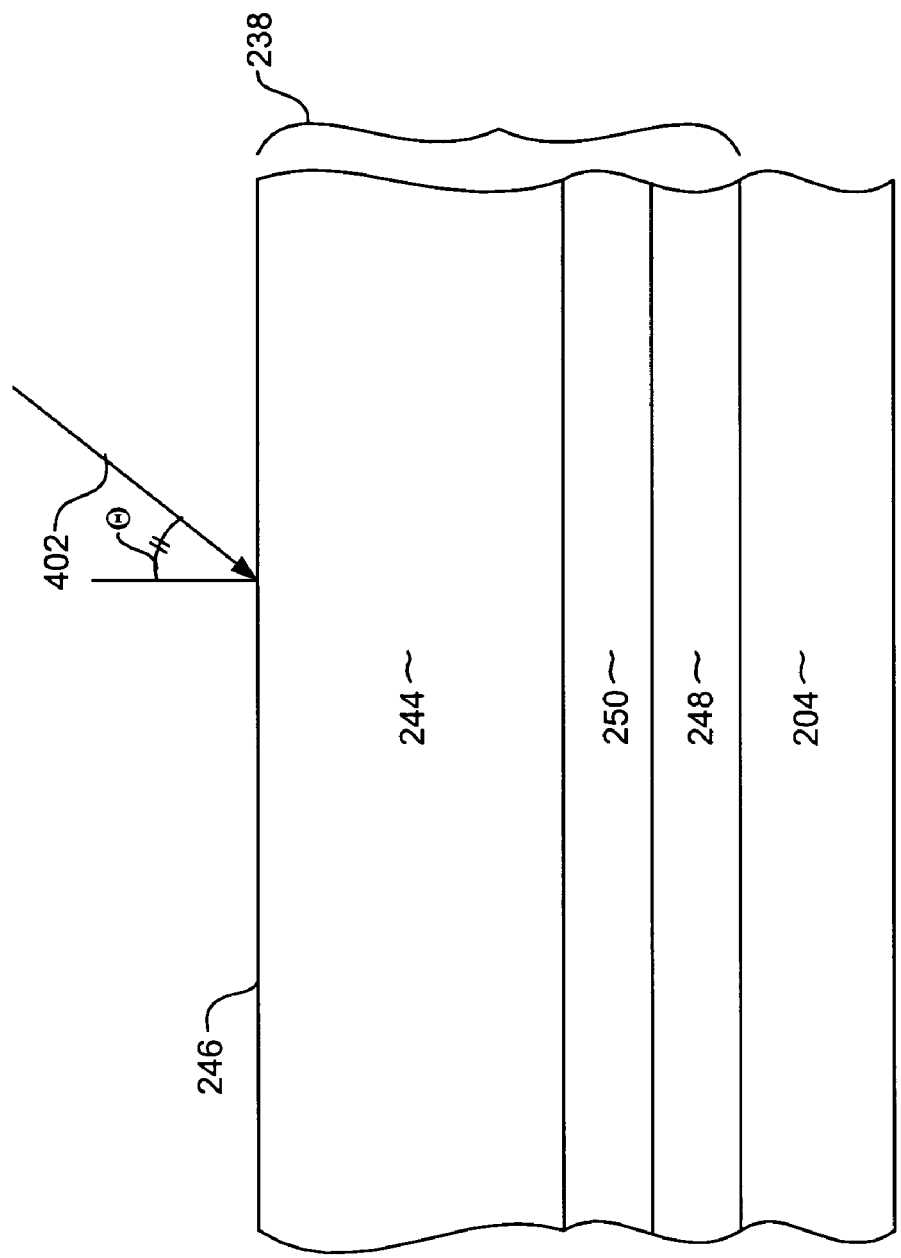
FIGS. 4-6 are views illustrating a method for forming an anisotropic roughness on a surface of an underlayer.
Figure 5:
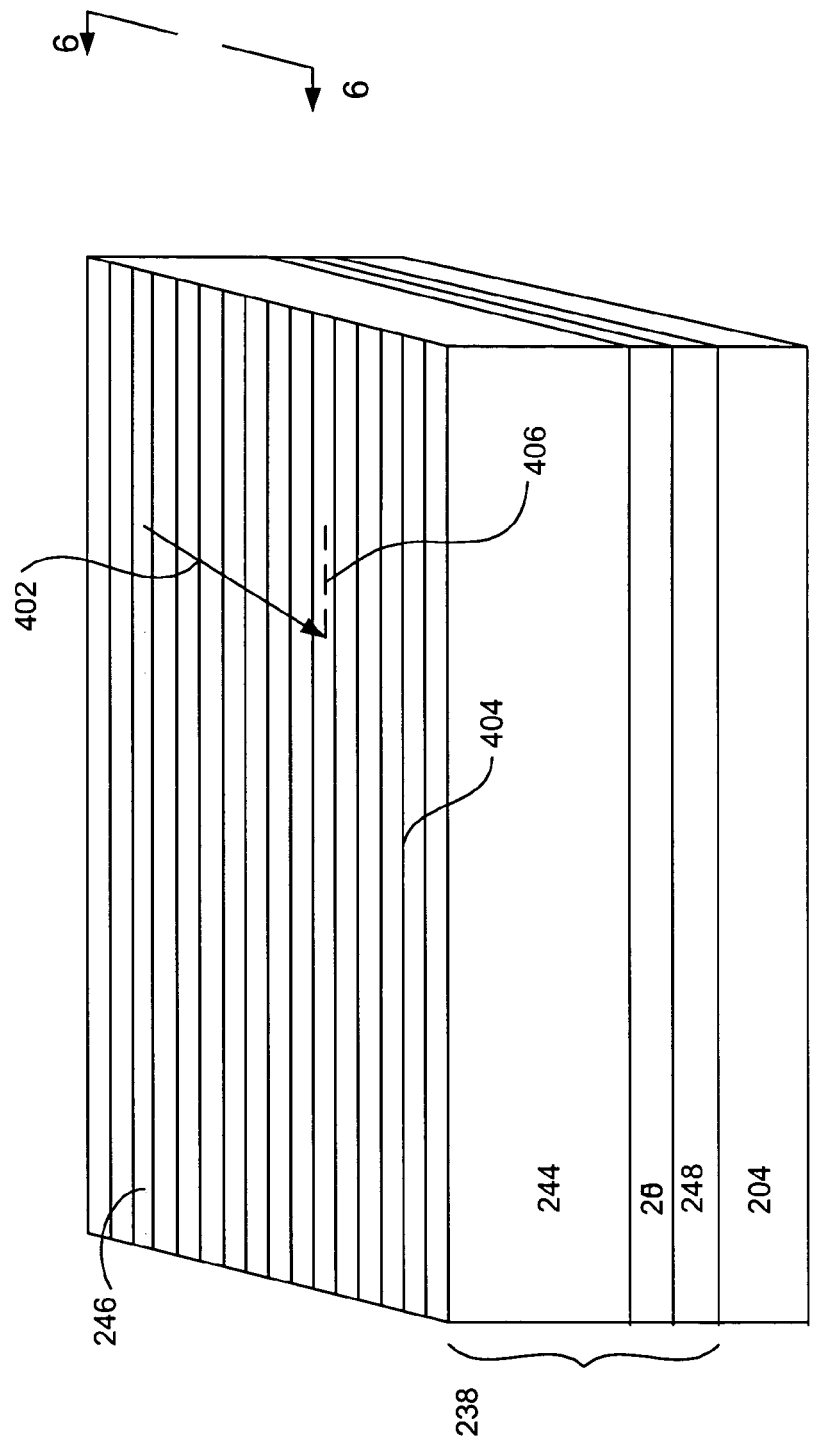
Figure 6:
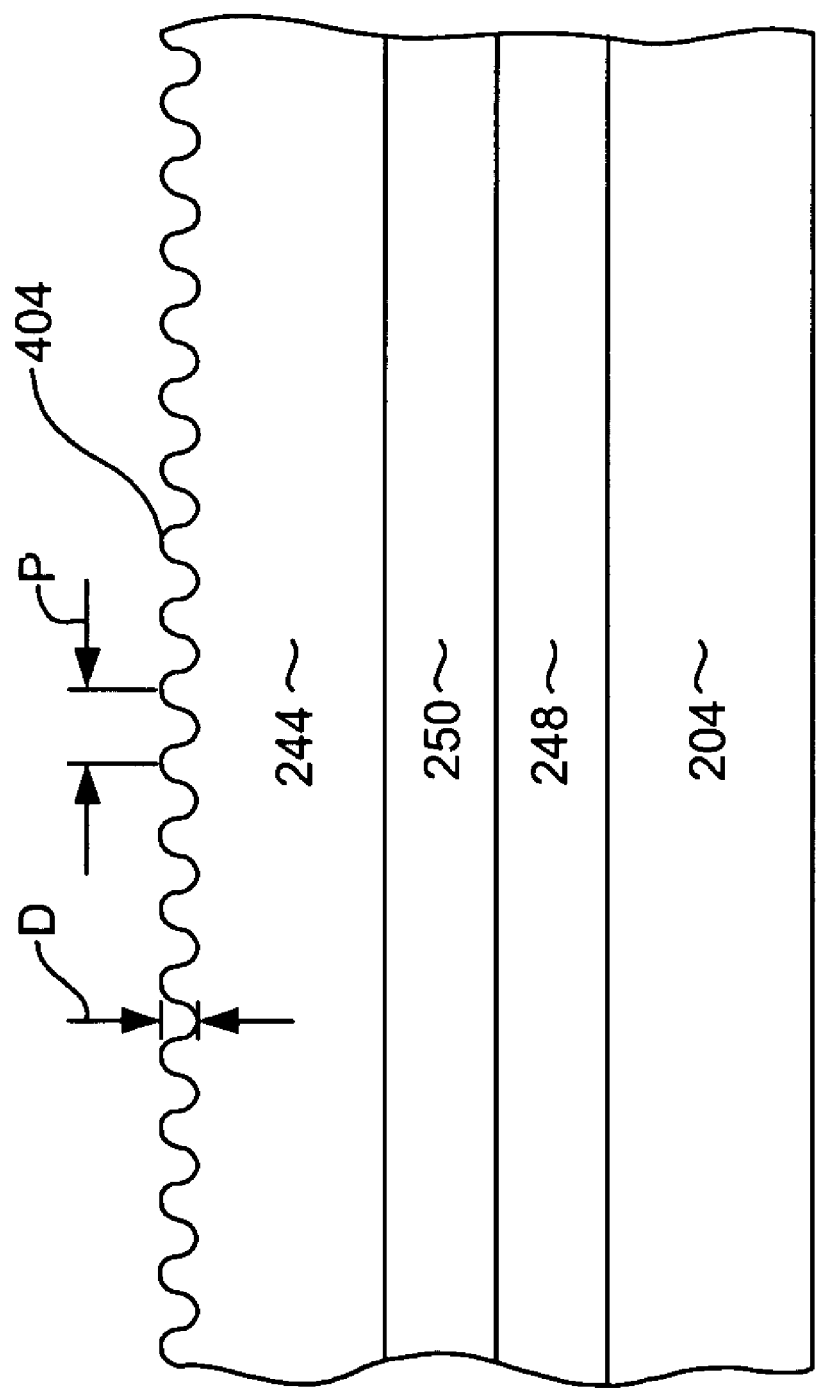

With reference to FIGS. 4 through 6, the construction of the underlayer 238 is described. A substrate is provided, which can be, for example, the gap layer 204 formed by depositing an insulating material such as alumina. The first and second sub layers 248, 250 are then deposited. The first sub layer can be formed by sputter depositing a layer of NiFeCr having a thickness of 20 to 30 Angstroms or about 25 Angstroms, and the second sub layer 250 can be formed by sputter depositing a layer of NiFe to a thickness of 4 to 15 Angstroms or about 8 Angstroms. The second layer 244 is then formed by sputter depositing a layer of PtMn. The PtMn layer 244 can be deposited to a thickness of 30 to 100 Angstroms.

An ion beam etch 402 is then performed at an angle Θ with respect to a normal to the surface of the PtMn layer 244 and without rotation of the substrate the underlayer is deposited on (i.e. without rotating the chuck). With reference to FIGS. 5 and 6, the angled ion etch 402 induces anisotropic roughness for example in the form of oriented ripples or facets 404. Depending on material and etch conditions the ripples or facets may be oriented predominantly in a direction substantially perpendicular or substantially parallel to the in plane projection 406 of the ion beam onto the surface 246 of the layer 244. The typical or average pitch P of the ripples 404 is between 10-200 nm, their average depth D is between 0.5 to 5 nm or about 1 nm. The angled ion mill significantly reduces the thickness of the PtMn layer 244 so that only 10 to 30 Angstroms or about 20 Angstroms may remain after ion milling. For a CIP sensor it is desirable that the PtMn layer 244 of the underlayer 238 be as thin as practical in order to prevent current shunting through the sensor.

After the angled ion etch 402 has been performed sufficiently to form the desired ripples or facets 404, the AFM layer 232 (FIG. 2) can be formed over the underlayer 238. The AFM layer 232 can be formed by sputter depositing layer of antiferromagnetic material such as PtMn or IrMnCr over the underlayer 238. In order to have antiferromagnetic properties, the AFM layer 232 must be deposited significantly thicker than the underlying PtMn layer 244. Therefore, the AFM layer 232 preferably has a thickness of at least 100 Angstroms, and preferably has a thickness of about 150 Angstroms.

The angled ion etch 402 is preferably performed at an angle of between 20 and 80 degrees and is more preferably performed at an angle of between 35 and 65 degrees with respect to the normal to the surface 246 of the underlayer 238. The exact voltage, current, and angle conditions depend on the type and characteristics of the ion source in use.

Thereafter, with reference again to FIG. 2, the remaining sensor layer can be deposited. For example, the pinned layer structure 222 can be formed by sputter depositing a first layer of CoFe to form the AP1 layer 226, sputter depositing the Ru coupling layer 230 and then depositing another layer of CoFe to form the AP2 layer 228. The Cu spacer layer 224 (or alumina barrier in the case of a tunnel valve) can then be sputter deposited, followed by the free layer 220 and capping layer 240.

The surface treatment of the underlayer 238 causes a very strong exchange coupling between the AFM layer 232 and the pinned layer structure 222, and greatly increases the pinning field strength. Pinning strength can be measured using high-field transfer curves. The pinning field is characterized by the reverse fields, at which point the resistance reaches 95% and 50% of its maximum value (H95 and H50 respectively). By way of example, a standard AFM pinned magnetoresitive sensor not constructed according to the present invention has H95=1119 Oe, and H50=2709 Oe. By comparison, a sensor constructed according to the present invention has H95=1195 Oe and H50=3005 Oe. Therefore, the present invention provides a pinning strength improvement of approximately 9% over prior art structures. A sensor according to the present invention also exhibits excellent dR/R both at high and low fields.

Although the above described invention has been described in terms of a current in plane sensor, the invention could just as easily be embodied in a current perpendicular to plane GMR sensor or embodied in a tunnel valve (also a current perpendicular to plane sensor) in which case the electrically insulating gap layers 204, 206 would be replaced with electrically conductive lead layers. If embodied in a tunnel valve sensor, the electrically conductive spacer layer 224 would be replaced with a thin electrically insulating barrier layer. In addition, the invention could be embodied in a sensor having an in stack bias structure rather than having the laterally opposed hard bias layers shown and described in FIG. 2.

Figure 7:
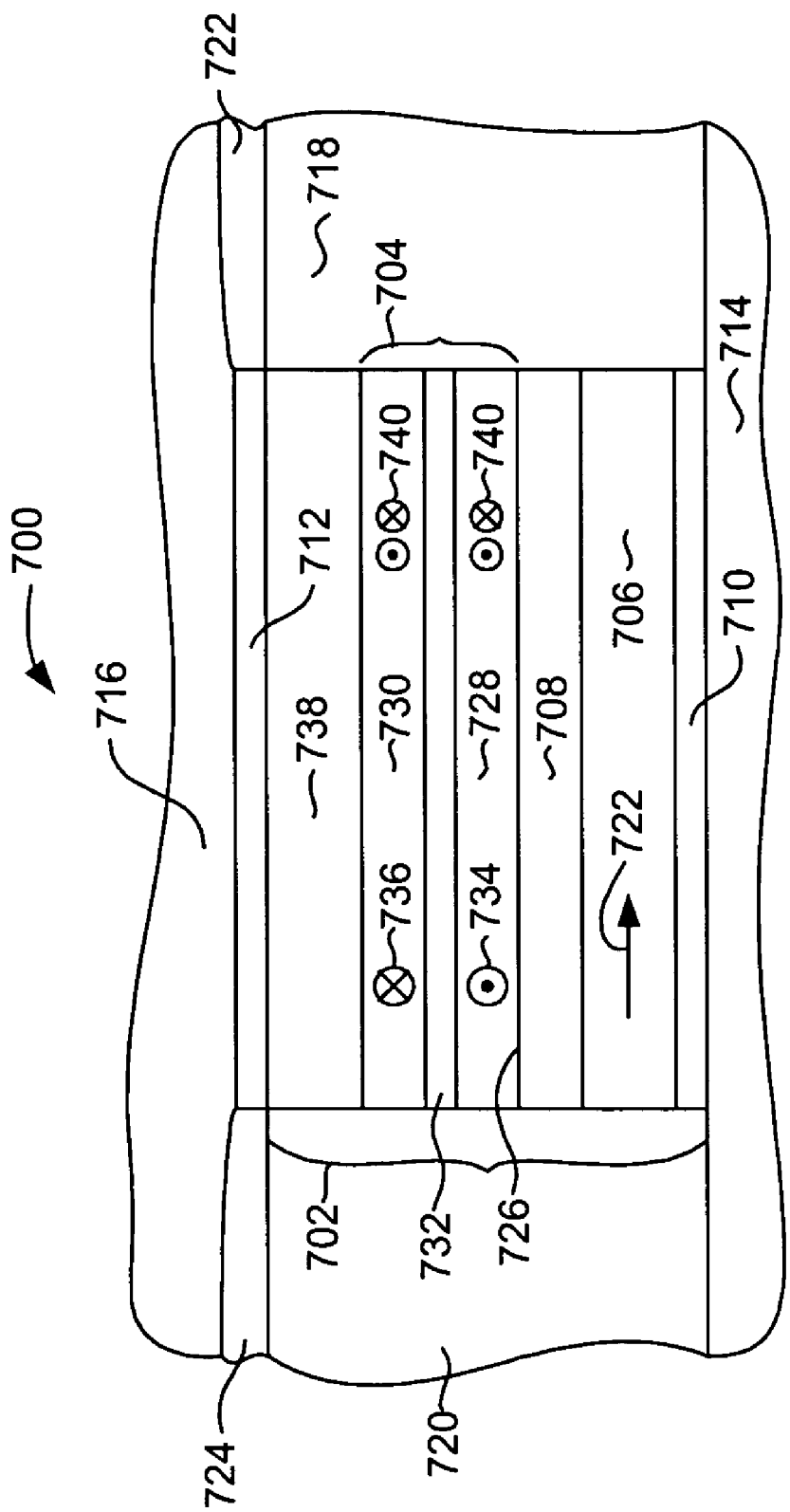
FIG. 7 is an ABS view of an alternate embodiment of the invention.

With reference now to FIG. 7, in another embodiment of the invention, a sensor 700 includes a sensor stack 702 having a pinned layer structure 704 that is constructed above a magnetic free layer 706. A non-magnetic, electrically conductive spacer 708 layer is constructed between the free layer 706 and the pinned layer 704. If the invention is embodied in a tunnel valve sensor, the layer 708 would be a thin, non-magnetic, electrically insulating barrier layer, constructed of a material such as, for example alumina. The sensor stack 702 may also include a seed layer 710, disposed at the bottom of the sensor stack for promoting a desired epitaxial growth in the layers of the sensor stack. The sensor stack 702 may also include a cap layer 712 such as Ta formed at the top of the sensor stack 702.

The sensor stack 702 is sandwiched between first and second non-magnetic, electrically insulating gap layers 714, 716 in the case of a current in plane CIP sensor. In the case of a current perpendicular to plane CPP sensor, the layers 714, 716 would be electrically conducting lead layers. First and second hard bias layers 718, 720 may be provided at either side of the sensor to provide a bias field for biasing the magnetic moment 722 of the free layer 706. First and second electrically conductive lead layers 722, 724 may be provided at the top of the hard bias layers 718, 720, in the case where the sensor 700 is a CIP sensor, to provide a sense current to the sensor stack 702.

With continued reference to FIG. 7, the spacer/barrier layer 708 has a surface 726 that has been treated by an ion mill process to provide the surface 726 with an anisotropic roughness or texture. This process is as described in FIGS. 4-6 with the surface 726 of the layer 708 being substituted for surface 246 of layer 244 in FIGS. 4-6. The pinned layer 704 deposited over the treated surface 726 of the spacer/barrier layer 708 can be of several different configurations, such as simple pinned, but is preferably an AP coupled structure having first and second ferromagnetic layers AP1 730, AP2 728 that are antiparallel coupled across an AP coupling layer 732. The AP1 and AP2 layers 730, 728 can be constructed of a magnetic material such as, for example, CoFe, and the AP coupling layer can be constructed of, for example, Ru. The AP1 and AP2 layers 730, 728 have magnetic moments 734, 736 that are oriented in antiparallel directions that are both perpendicular to the air bearing surface ABS and perpendicular to the direction of magnetization 722 of the free layer 706. The AP1 layer 730 is exchange coupled with a layer of antiferromagnetic material (AFM layer) 738, which can be for example PtMn, IrMn or some other suitable antiferromagnetic material. The exchange coupling between the AFM layer 738 and the AP2 layer pins the magnetic moment 736 of the AP2 layer 728.

With reference still to FIG. 7, the anisotropic texture of the surface 726 of the spacer/barrier layer 708 is configured to induce a strong magnetic anisotropy 740 in the ferromagnetic AP1 and AP2 layers 730, 728, in a desired direction that is substantially perpendicular to the ABS (into and out of the plane of the page in FIG. 7). As mentioned above, this surface texture of the surface 726 is created by a low power stationary ion mill that is performed as described with reference to FIGS. 4-6. The ion mill may be performed at an angle in a direction that is either perpendicular to or parallel with the ABS. Whether the ion mill is performed parallel to or perpendicular to the ABS depends upon factors such as material selection of the spacer/barrier layer 708 and the materials making up the AP1 and AP2 layers 730, 728. However, the direction of the ion mill is chosen so as to result in a magnetic anisotropy 740 that is directed as desired perpendicular to the ABS. The spacer/barrier layer 708 preferably has a thickness after the ion mill of about 20 to 40 Angstroms. Therefore, the deposited thickness should be chosen such that the final thickness of the spacer/barrier layer 708 will have this final thickness of 20 to 40 Angstroms. The magnetic anisotropy 740 provided by the texture of the surface 708 greatly increases the pinning field, and when combined with exchange pinning from the AFM layer 738 results in an extremely stable pinned layer structure 704.

Figure 8:
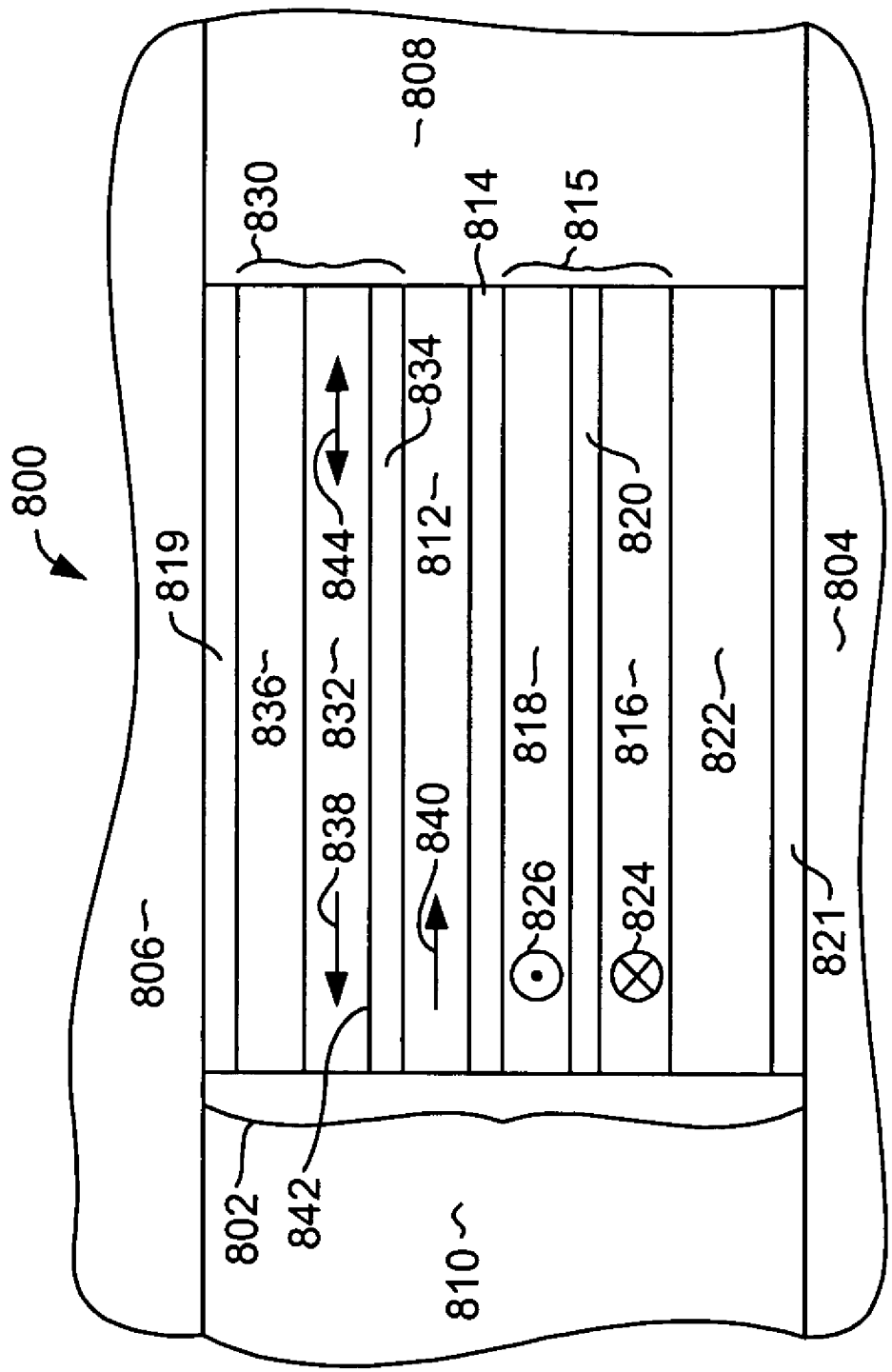
FIG. 8 is an ABS view of another alternate embodiment of the invention.

With reference now to FIG. 8, a read head 800 according to an embodiment of the invention has a sensor stack 802 sandwiched between first and second electrically conductive lead layers 804, 806. First and second electrically insulating fill layers 808, 810 are provided at either side of the sensor stack to prevent sense current from being shunted around the sensor stack 802. It should be pointed out that the above description of the lead layers 804, 806 and fill layers 808, 810 are for the case where the read head 800 is a CPP sensor, such as a CPP GMR or a tunnel valve. If the sensor 800 is embodied in a CIP sensor, the layers 804, 806 would be electrically insulating gap layers and the layers 808, 810 would be electrically conductive lead layers.

With continued reference to FIG. 8, the sensor stack 802 includes a pinned layer structure 815, a magnetic free layer 812 and a non-magnetic, electrically conductive spacer layer 814 sandwiched between the free layer and the pinned layer. The spacer layer 814 can be, for example Cu. If the read head 800 is embodied in a tunnel valve sensor, then the layer 814 would be a thin non-magnetic electrically insulating barrier layer. The free layer 812 can be constructed of several magnetic materials such as NiFe, CoFe, Co or a combination of these or other materials. The pinned layer structure 815 can be one of several pinned layer designs and is preferably an AP pinned structure that includes first and second magnetic layers AP1 816, AP2 818 and an antiparallel coupling layer (AP coupling layer) 820 such as Ru or Ir sandwiched between AP1 and AP2 816, 818. The AP1 and AP2 layers 816, 818 can be constructed of several magnetic materials, such as, for example CoFe. The AP1 layer 816 is exchange coupled with a layer of ferromagnetic material AFM layer 822, which strongly pins the magnetization 824 of the AP1 layer in a direction substantially perpendicular to the ABS. Antiparallel coupling between the AP1 and AP2 layers 816, 818 pins the magnetization 826 of the AP2 layer 818 in a direction antiparallel with the magnetization 826 of the AP1 layer 818. A capping layer 819, such as Ta may be provided at the top of the sensor stack 802, and a seed layer 821 may be provided at the bottom of the sensor stack 802.

With reference still to FIG. 8, the free layer 812 has a magnetization 828 that is biased in a direction substantially parallel with the ABS, but that is free to rotate in response to an external magnetic field. The magnetization 828 of the free layer 812 is biased by an in stack bias structure 830. The in stack bias structure 830 includes a ferromagnetic biasing layer 832, which is separated from the free layer 812 by a non-magnetic spacer layer 834. The magnetic biasing layer 832 is exchange coupled with a layer of antiferromagnetic material (AFM layer) 836, which pins the magnetization of 838 of the biasing layer 832 in a direction substantially parallel to the ABS. The biasing layer 832 is magnetostatically coupled with the free layer 812 so that it biases the magnetization 840 of the free layer in a direction that is antiparallel with the magnetization 838 of the biasing layer 832 and parallel with the ABS.

With reference still to FIG. 8, the non-magnetic spacer layer 834 has a surface 842 that is configured with an anisotropic surface texture or surface roughness. The anisotropic texture of the surface 842 induces a strong magnetic anisotropy 844 in the biasing layer 832. This magnetic anisotropy is in a desired direction substantially parallel with the ABS and greatly increases the strength of the pinning of the magnetization 838 of the biasing layer 832. The surface anisotropic surface texture is created by the ion milling process described with reference to FIGS. 4 through 6, with the surface 246 of layer 244 in FIGS. 4-6 being replaced by surface 842 of layer 834 of FIG. 8. The direction of the ion milling and the direction of the resulting anisotropic surface texture are chosen to induce the desired magnetic anisotropy 844 in the biasing layer 832 in a desired direction parallel with the ABS. The spacer layer 834 can be constructed of a non-magnetic material such as Ta, Cu or Ru, and is preferably constructed of Ta. The spacer layer 834 preferably has a thickness after ion milling that will result in a small (weak) antiparallel coupling between the free layer 812 and the biasing layer 838. As mentioned above, the in stack bias structure described above can be used with a CIP or CPP sensor including a CPP GMR sensor or a tunnel valve.

It should be pointed out as well that the invention could be embodied in a sensor having an in stack bias structure such as that described above, but with a magnetic anitostropy in the pinned layers in a direction perpendicular to the ABS in addition to the anisotropy 844 in the biasing layer 832. In this embodiment The AFM layer 822 that pins the magnetization of the pinned layer structure 815 would be formed on an underlayer that has been formed with an anisotropic roughness that induces the magnetic anisotropy in the pinned layer structure 815. The present invention advantageously allows for the setting magnetic anisotropies in different and even perpendicular directions.

Therefore, while various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
an underlayer having a surface;
an antiferromagnetic layer (AFM layer) contacting the surface of the underlayer; and
a pinned layer structure exchange coupled with the AFM layer;
wherein the surface of the underlayer has an anisotropic roughness and wherein the underlayer further comprises:
a layer of NiFeCr having a thickness of 20-30 Angstroms;
a layer of NiFe having a thickness of 4-15 Angstroms; and
a layer of PtMn having a thickness of 10-30 Angstroms.

2. A sensor as in claim 1, wherein the pinned layer structure has a magnetization that is pinned, and wherein the anisotropic roughness of the surface of the underlayer increases the pinning of the magnetization of the pinned layer.

3. A sensor as in claim 1, wherein the underlayer comprises:
a seed layer; and
a crystalline layer formed over the seed layer.

4. A sensor as in claim 1 wherein the underlayer comprises:
a first seed layer;
a second seed layer formed on the first seed layer; and
a crystalline layer formed on the second seed layer.

5. A sensor as in claim 1 further comprising a magnetic free layer and a non-magnetic electrically conductive spacer layer sandwiched between the magnetic free layer and the pinned layer structure, and wherein the sensor is a current perpendicular to plane (CPP) GMR sensor.

6. A sensor as in claim 1 further comprising a magnetic free layer and a non-magnetic electrically insulating barrier layer sandwiched between the magnetic free layer and the pinned layer structure, and wherein the sensor is a tunnel valve.

7. A sensor as in claim 1 wherein the underlayer comprises:
a layer of NiFeCr having a thickness of about 25 Angstroms;

a layer of NiFe having a thickness of about 8 Angstroms; and a layer of PtMn having a thickness of about 25 Angstroms.

8. A magnetoresistive sensor as in claim 7 wherein the AFM layer has a thickness of at least 100 Angstroms.

9. A magnetoresitive sensor as in claim 7 wherein the AFM layer has a thickness of about 150 Angstroms.

10. A magnetoresitive sensor as in claim 1 further comprising:
a free layer; and
a non-magnetic, electrically conductive spacer layer sandwiched between the free layer and the pinned layer structure.

11. A magnetoresitive sensor as in claim 1, further comprising:
a free layer; and
a non-magnetic, electrically insulating barrier layer sandwiched between the free layer and the pinned layer.

12. A sensor as in claim 1 further comprising a magnetic free layer and a non-magnetic electrically conductive spacer layer sandwiched between the magnetic free layer and the pinned layer structure, and wherein the sensor is a current in plane (CIP) GMR sensor.

13. A magnetoresitive sensor, comprising:
an underlayer including a seed layer and a layer of PtMn formed on the seed layer, the layer of PtMn having a surface configured with an anisotropic roughness; and
an antiferromagnetic layer (AFM layer) formed on the surface of the PtMn layer;
wherein the anisotropic roughness comprises ripples having an average depth of 0.5-5 nm and an average pitch of 10-200 nm.

14. A sensor as in claim 13, wherein the AFM layer comprises PtMn.

15. A sensor as in claim 13 wherein the AFM layer comprises IrMnCr.

16. A sensor as in claim 13 wherein the PtMn layer of the underlayer has a thickness not greater than 30 Angstroms and the AFM layer comprises PtMn and has a thickness of at least 100 Angstroms.

17. A magnetoresistive sensor as in claim 13 further comprising:
a free layer; and
a non-magnetic, electrically conductive spacer layer sandwiched between the free layer and the pinned layer structure.

18. A magnetoresistive sensor as in claim 13 further comprising:
a free layer; and
a non-magnetic, electrically insulating barrier layer sandwiched between the free layer and the pinned layer structure.

19. A magnetoresistive sensor as in claim 13 wherein the PtMn layer of the underlayer has a thickness no greater than 30 Angstroms and the AFM layer has a thickness of at least 100 Angstroms.

20. A magnetoresistive sensor, comprising:
an underlayer having a surface;
an antiferromagnetic layer (AFM layer) contacting the surface of the underlayer; and
a pinned layer structure exchange coupled with the AFM layer;
wherein the surface of the underlayer has an anisotropic roughness; and
wherein the anisotropic roughness comprises ripples having an average depth of 0.5-5 nm and an average pitch of 10-200 nm.

21. A magnetoresistive sensor comprising:
an underlayer; and
a layer of antiferromagnetic material (AFM layer) adjacent to the underlayer; and
an interface between the underlayer and AFM layer, the interface being configured with an anisotropic roughness;
wherein the anisotropic roughness comprises ripples having an average depth of 0.5-5 nm and an average pitch of 10-200 nm.

22. A sensor as in claim 21 wherein the underlayer includes a seed layer and a PtMn layer, the PtMn being sandwiched between the seed layer and the AFM layer.

23. A sensor as in claim 22 wherein the PtMn layer of the underlayer has a thickness no greater than 30 Angstroms and wherein the AFM layer comprises PtMn and has a thickness of at least 100 Angstroms.

24. A sensor as in claim 21 wherein the underlayer includes first and second seed layers and a layer of PtMn, the second seed layer being sandwiched between the first seed layer and the PtMn layer and the PtMn layer being sandwiched between the second seed layer and the AFM layer.

25. A magnetoresistive sensor, comprising:
an underlayer including a first seed layer a second seed layer formed on the first seed layer, and a layer of PtMn formed over the second seed layer, the layer of PtMn having a surface configured with an anisotropic roughness; and
an antiferromagnetic layer (AFM layer) formed on the surface of the PtMn layer;
wherein the anisotropic roughness comprises ripples having an average depth of 0.5-5 nm and an average pitch of 10-200 nm.

26. A sensor as in claim 25 wherein the first seed layer comprises NiFeCr and the second seed layer comprises NiFe.

27. A magnetoresitive sensor, comprising:
a free layer;
a pinned layer structure; and
a non-magnetic layer disposed between the pinned layer and the free layer, the non-magnetic layer having a surface configured with an anisotropic surface texture that induces a magnetic anisotropy in the pinned layer structure, the surface being in contact with the pinned layer structure.

28. A sensor as in claim 27 wherein the non-magnetic layer comprises a material selected from the group consisting of: Cu, alumina, magnesium oxide and titanium oxide.

29. A magnetoresisive sensor, comprising:
a magnetic free layer;
a magnetic pinned layer structure;
a first non-magnetic layer sandwiched between the free layer and the pinned layer; and
an in stack bias structure adjacent to the free layer, the in stack bias structure further comprising:
a second non-magnetic layer having a surface with an anisotropic texture;
a magnetic biasing layer formed over the second non-magnetic layer and contacting the textured surface; and
a layer of antiferromagnetic material (AFM layer) formed over the magnetic biasing layer; and
wherein the texture of the surface of the second non-magnetic layer induces a magnetic anisotropy in the magnetic biasing layer.

30. A sensor as in claim 29, wherein the pinned layer structure is constructed upon a second layer of antiferromagnetic material (second AFM) that is formed over an underlayer that has a surface configured with an anisotropic roughness that induces a magnetic anisotropy in the pinned layer.

31. A sensor as in claim 29 wherein the second non-magnetic layer comprises a material selected from the group consisting of: Ta, Ru, Cu, Cr, Rh and Ti.

32. A sensor as in claim 1, 13, 25, 21, or 29 wherein the AFM layer comprises a material selected from the group consisting of: PtMn, IrMn and IrMnCr.

* * * * *